(12) United States Patent
Matsumoto et al.

(10) Patent No.: US 12,055,606 B2
(45) Date of Patent: Aug. 6, 2024

(54) POLARIZATION-TRANSFER APPARATUS, AND MICROFLUIDIC DEVICE

(71) Applicant: NATIONAL UNIVERSITY CORPORATION HOKKAIDO UNIVERSITY, Sapporo (JP)

(72) Inventors: Shingo Matsumoto, Hokkaido (JP); Neil Stewart, Hokkaido (JP); Yoshiki Uchio, Hokkaido (JP)

(73) Assignee: NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 349 days.

(21) Appl. No.: 17/632,541

(22) PCT Filed: Aug. 6, 2020

(86) PCT No.: PCT/JP2020/030152
§ 371 (c)(1),
(2) Date: Feb. 3, 2022

(87) PCT Pub. No.: WO2021/025105
PCT Pub. Date: Feb. 11, 2021

(65) Prior Publication Data
US 2022/0276327 A1 Sep. 1, 2022

(30) Foreign Application Priority Data

Aug. 6, 2019 (JP) .............................. 2019-144537

(51) Int. Cl.
*G01R 33/28* (2006.01)
*G01R 33/30* (2006.01)
(Continued)

(52) U.S. Cl.
CPC ......... *G01R 33/282* (2013.01); *G01R 33/302* (2013.01); *G01R 33/445* (2013.01); *G01R 33/4608* (2013.01)

(58) Field of Classification Search
CPC ........... H04N 1/00042; H04N 1/00034; H04N 1/00082; G01D 5/2291; G01B 7/02
See application file for complete search history.

(56) References Cited

U.S. PATENT DOCUMENTS 7,744,822 B2 6/2010 Sakurai
2007/0148054 A1 6/2007 Takahashi et al.
(Continued)

FOREIGN PATENT DOCUMENTS

JP 2007171155 A 7/2007

OTHER PUBLICATIONS

International Search Report for International Application No. PCT/JP2020/030152; Date of Mailing, Oct. 13, 2020.
(Continued)

*Primary Examiner* — Jermele M Hollington
*Assistant Examiner* — Taqi R Nasir
(74) *Attorney, Agent, or Firm* — CANTOR COLBURN LLP

(57) ABSTRACT

This polarization-transfer apparatus, which induces hyperpolarization with respect to a precursor containing $^{13}C$ nuclei or $^{15}N$ nuclei, has a microfluidic device in which the precursor is guided in a magnetic shield such that the strength of the magnetic field acting on the precursor monotonically decreases from approximately 1 μT to zero magnetic field, and then the precursor is guided in the magnetic shield such that the strength of the magnetic field acting on the precursor monotonically increases from zero magnetic field to approximately 1 μT.

19 Claims, 13 Drawing Sheets

(51) Int. Cl.
*G01R 33/44* (2006.01)
*G01R 33/46* (2006.01)

(56) References Cited

U.S. PATENT DOCUMENTS

| | | | | |
|---|---|---|---|---|
| 2008/0106263 A1* | 5/2008 | Fey | ......................... | G01R 33/30 |
| | | | | 324/321 |
| 2011/0095759 A1* | 4/2011 | Bhattacharya | ......... | G01R 33/30 |
| | | | | 324/307 |
| 2015/0217262 A1* | 8/2015 | Wagner | ................. | B01J 19/088 |
| | | | | 424/9.3 |
| 2017/0168030 A1* | 6/2017 | Mensa | ................. | G01N 30/722 |

OTHER PUBLICATIONS

Reineri, et al., "ParaHydrogen Induced Polarization of 13C carboxylate resonance in acetate and pyruvate", Nature Communications, doi:10.1038/ncomms/6858; Jan. 2015; 6 pages.

Stewart, et al. "Long-range heteronuclear J-coupling constants in esters: Implications for 13C metabolic MRI by side-arm parahydrogen-induced polarization", J. Magnetic Resonance 296, (2018), 85-92 ("URL: https://www.sciencedirect.com/science/article/abs/pii/S1090780718302131?via%3Dihub").

Truong, et al., "15N Hyperpolarization by Reversible Exchange Using Sabre-Sheath", J. Phys. Chem. C Mar. 30, 2015, 119, pp. 8786-8797, ("URL:https://www.ncbi.nlm.nih.gov/pmc/articles/PMC4419867/pdf/jp5b01799.pdf").

EPO Extended European Search Report for corresponding EP Application No. 20849157.1; Mailing Date, Jul. 31, 2023.

\* cited by examiner

"Prior Art"

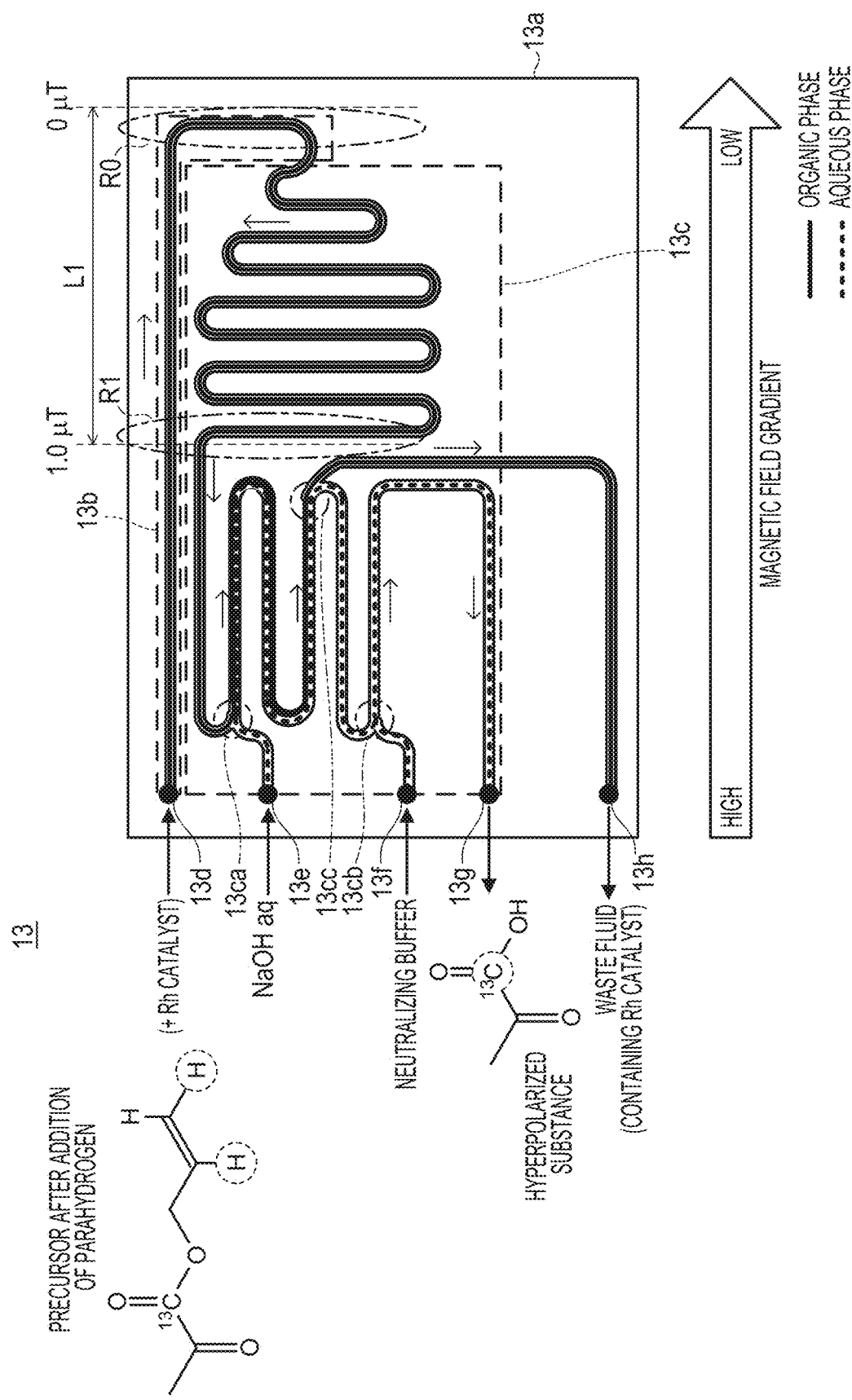

POLARIZATION-TRANSFER APPARATUS, AND MICROFLUIDIC DEVICE

CROSS REFERENCE TO RELATED APPLICATIONS

This is the U.S. national stage of application No. PCT/JP2020/030152, filed on Aug. 6, 2020. Priority under 35 U.S.C. § 119(a) and 35 U.S.C. § 365(b) is claimed from Japanese Application No. 2019-144537, filed Aug. 6, 2019, the disclosure of which is also incorporated herein by reference.

TECHNICAL FIELD

The present disclosure relates to a polarization transfer apparatus and a microfluidic device.

BACKGROUND ART

A parahydrogen induced polarization method (hereinafter referred to as a "PHIP method") and a dynamic nuclear polarization method (hereinafter referred to as a "DNP method") are known as techniques for improving the measurement sensitivity of nuclear magnetic resonance (NMR) spectroscopy.

The PHIP method and the DNP method are techniques of inducing hyperpolarization of a $^1H$ nucleus, a $^{13}C$ nucleus, a $^{15}N$ nucleus, or the like in a compound to greatly improve the sensitivity of $^1H$, $^{13}C$, $^{15}N$, or another nuclear magnetic resonance.

In particular, the PHIP method can induce hyperpolarization of a $^{13}C$ or $^{15}N$ nucleus at normal temperature in a short time and therefore attracts attention as a technique replacing the DNP method, which requires a very low temperature (for example, -270° C.) environment and a long time (see, for example, Patent Literature 1, Non-Patent Literature 1, Non-Patent Literature 2, and Non-Patent Literature 3).

FIG. 1 is an explanatory view of the outline of the PHIP method. FIG. 2 is an explanatory view of the pattern of a magnetic field variation applied to a precursor in the PHIP method. A technique called a "magnetic field cycle PHIP method (hereinafter referred to as an MFC PHIP method)" is described below.

In the PHIP method, first, a parahydrogen is added to a precursor (for example, an organic compound with a carbon multiple bond) labelled with a $^{13}C$ or $^{15}N$ nucleus. At this time, nuclear polarization occurs in $^1H$ nuclei derived from the parahydrogen in the precursor.

In the MFC PHIP method, the magnetic field variation as illustrated in FIG. 2 is applied to the precursor in such a state to transfer the nuclear polarization of the $^1H$ nuclei derived from the parahydrogen to a $^{13}C$ or $^{15}N$ nucleus. This can produce a substance labelled with a hyperpolarized $^{13}C$ or $^{15}N$ nucleus (hereinafter also referred to as a "hyperpolarized substance").

The pattern of the magnetic field variation illustrated in FIG. 2 indicates that the strength of the magnetic field (the strength of the magnetic flux density; the same applies hereinafter) applied to the precursor is changed from the geomagnetism (the magnetic field strength of approximately 50 µT on the earth; the same applies hereinafter) to approximately 1 µT in time τ1 after mixing with the parahydrogen and is then rapidly (that is, non-adiabatically) changed from approximately 1 µT to a zero magnetic field (the magnetic field strength near zero T; the same applies hereinafter) in time τ2. After time τ2, the magnetic field strength is slowly (that is, adiabatically) returned from the zero magnetic field to approximately 1 µT in time τ3 and is then rapidly returned from approximately 1 µT to the earth magnetic field in time τ4.

In the MFC PHIP method, it is thought that the rapid change from approximately 1 µT to the approximately zero magnetic field in time τ2 causes spin mixing between the $^1H$ nuclei derived from the parahydrogen of the precursor and a $^{13}C$ nucleus or the like, and the slow change from the zero magnetic field to the geomagnetism in times τ3 and τ4 causes spin reorientation and polarization transfer from the $^1H$ nuclei to the $^{13}C$ nucleus.

In the MFC PHIP method, in particular, the pattern of a magnetic field variation between approximately 1 µT and approximately zero T has a significant influence on the nuclear spin polarization ratio of a hyperpolarized substance (the degree of polarization of a $^{13}C$ or $^{15}N$ nucleus label in a precursor assembly; the same applies hereinafter).

CITATION LIST

Patent Literature

PTL 1
U.S. Patent Application Publication 2015/217262

Non-Patent Literatures

NPL 1
Francesca Reinert, et al. "Para Hydrogen Induced Polarization of 13C carboxylate resonance in acetate and pyruvate", NATURE COMMUNICATIONS, 2015, doi: 10.1038/ncomms6858, ("URL: https://www.nature.com/articles/ncomms6858.pdf")

NPL 2
Milton L. Truong, et al. "15N Hyperpolarization by Reversible Exchange Using SABRE-SHEATH", J. Phys. Chem. C 2015, 119, 8786-8797, ("URL: https://www.ncbi.nlm.nih.gov/pmc/articles/PMC4419867/pdf/jp5b01799.pdf")

NPL 3
Neil J. Stewart, et al. "Long-range heteronuclear J-coupling constants in esters: Implications for 13C metabolic MRI by side-arm parahydrogen-induced polarization.", J. Magn. Reson. 2018, 296, 85-92, ("URL: https://www.sciencedirect.com/science/article/abs/pii/S1090780718302131?via%3Dihub")

SUMMARY OF INVENTION

Technical Problem

In the MFC PHIP method according to the related art, the magnetic field acting on a precursor is manually controlled on the basis of an empirical rule. The MFC PHIP method according to the related art therefore has great variations in the nuclear spin polarization ratio of a hyperpolarized substance thus produced. Furthermore, there is a need for an apparatus that can automate the production of a hyperpolarized substance to produce a large amount of hyperpolarized substance.

Considering such a background, the present inventors have attempted a technique of guiding a precursor to which parahydrogen is added in a parahydrogen mixing apparatus through a tube in a magnetic shield with a zero magnetic field region formed therein to continuously produce a substance in which hyperpolarization is induced in the precursor. However, such a technique has been faced with the problem that the hyperpolarized substance cannot have a sufficient nuclear spin polarization ratio.

The present disclosure has been made in view of the above problems and aims to provide a polarization transfer apparatus that can stably and continuously produce a hyperpolarized substance with a high nuclear spin polarization ratio.

Solution to Problem

A primary part of the present disclosure which solves the problems mentioned above is directed to a polarization transfer apparatus for inducing hyperpolarization of a precursor containing a $^{13}C$ or $^{15}N$ nucleus, including: a magnetic field adjustment coil for generating a magnetic field gradient including a zero magnetic field region in a space surrounded by the magnetic field adjustment coil; and a microfluidic device coupled to a parahydrogen mixing apparatus and located in the space, the microfluidic device in the space guiding the precursor to which parahydrogen is added or the precursor mixed with the parahydrogen in the parahydrogen mixing apparatus, in which the microfluidic device includes a microchannel for guiding the precursor along the magnetic field gradient such that strength of a magnetic field acting on the precursor decreases monotonically from approximately 1 μT to a zero magnetic field at a first change rate, and then guiding the precursor along the magnetic field gradient such that the strength of the magnetic field acting on the precursor increases monotonically from the zero magnetic field to approximately 1 μT at a second change rate, and the first change rate is higher than the second change rate.

Advantageous Effects of Invention

A polarization transfer apparatus according to the present disclosure can stably produce a hyperpolarized substance with a high nuclear spin polarization ratio.

BRIEF DESCRIPTION OF DRAWINGS

FIG. 5 is a view of an example of a microfluidic device according to an embodiment;

DESCRIPTION OF EMBODIMENTS

Figure 1:
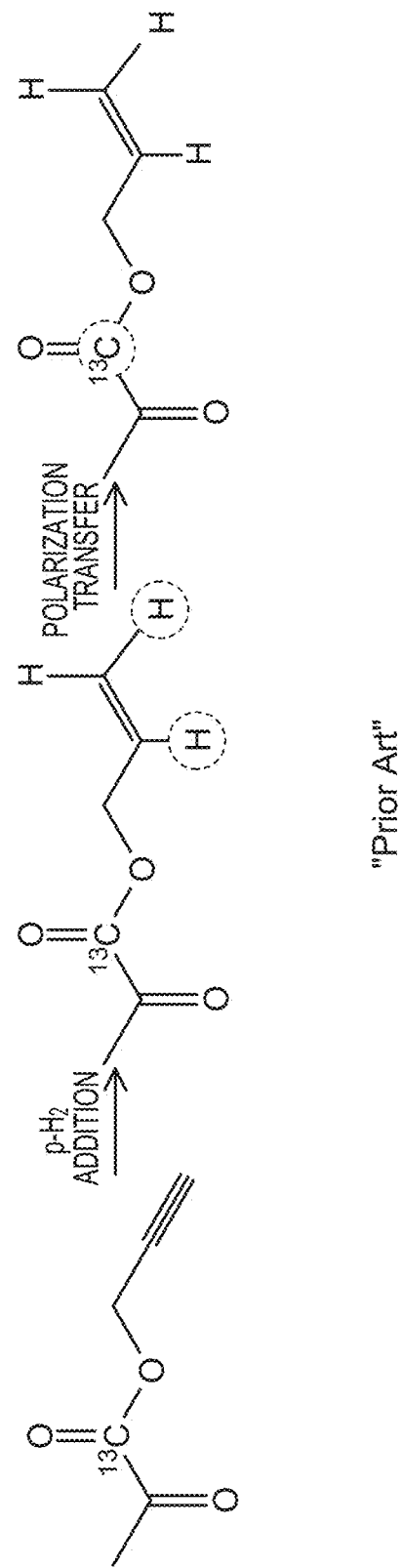
FIG. 1 is an explanatory view of the outline of the PHIP method.
Figure 2:
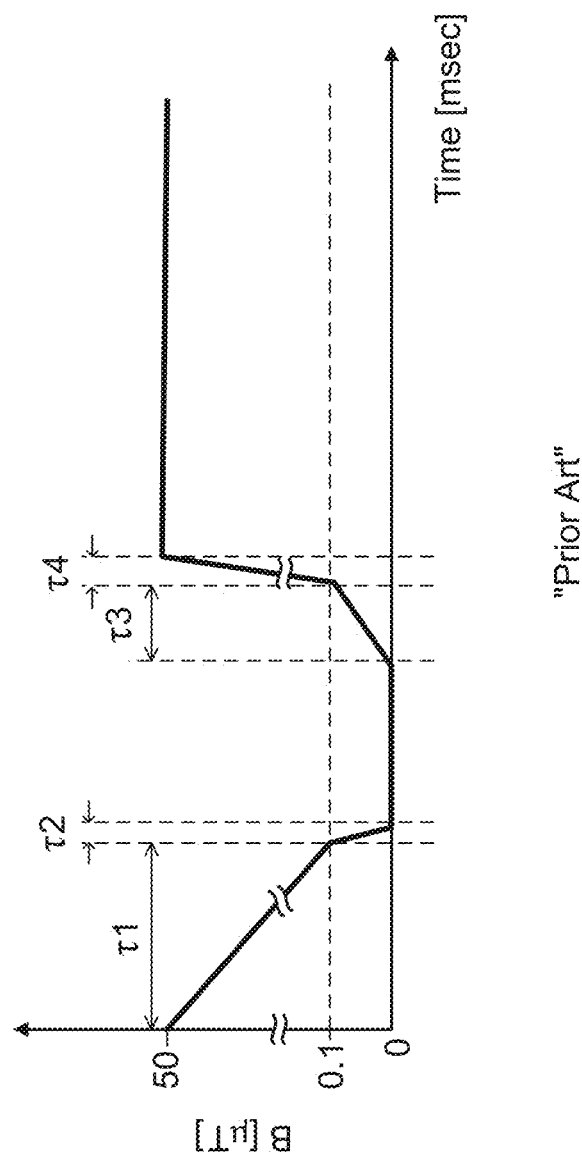
FIG. 2 is an explanatory view of the pattern of a magnetic field variation applied to a precursor in the PHIP method.

Preferred embodiments of the present disclosure are described in detail below with reference to the accompanying drawings. In the present specification and the drawings, constituents with substantially the same function are denoted by the same reference numerals and letters and are described only once.

[General Structure of Hyperpolarized Substance Production System]

A polarization transfer apparatus according to an embodiment and a general structure of a hyperpolarized substance production system including the polarization transfer apparatus are described below with reference to FIG. 3.

Figure 3:
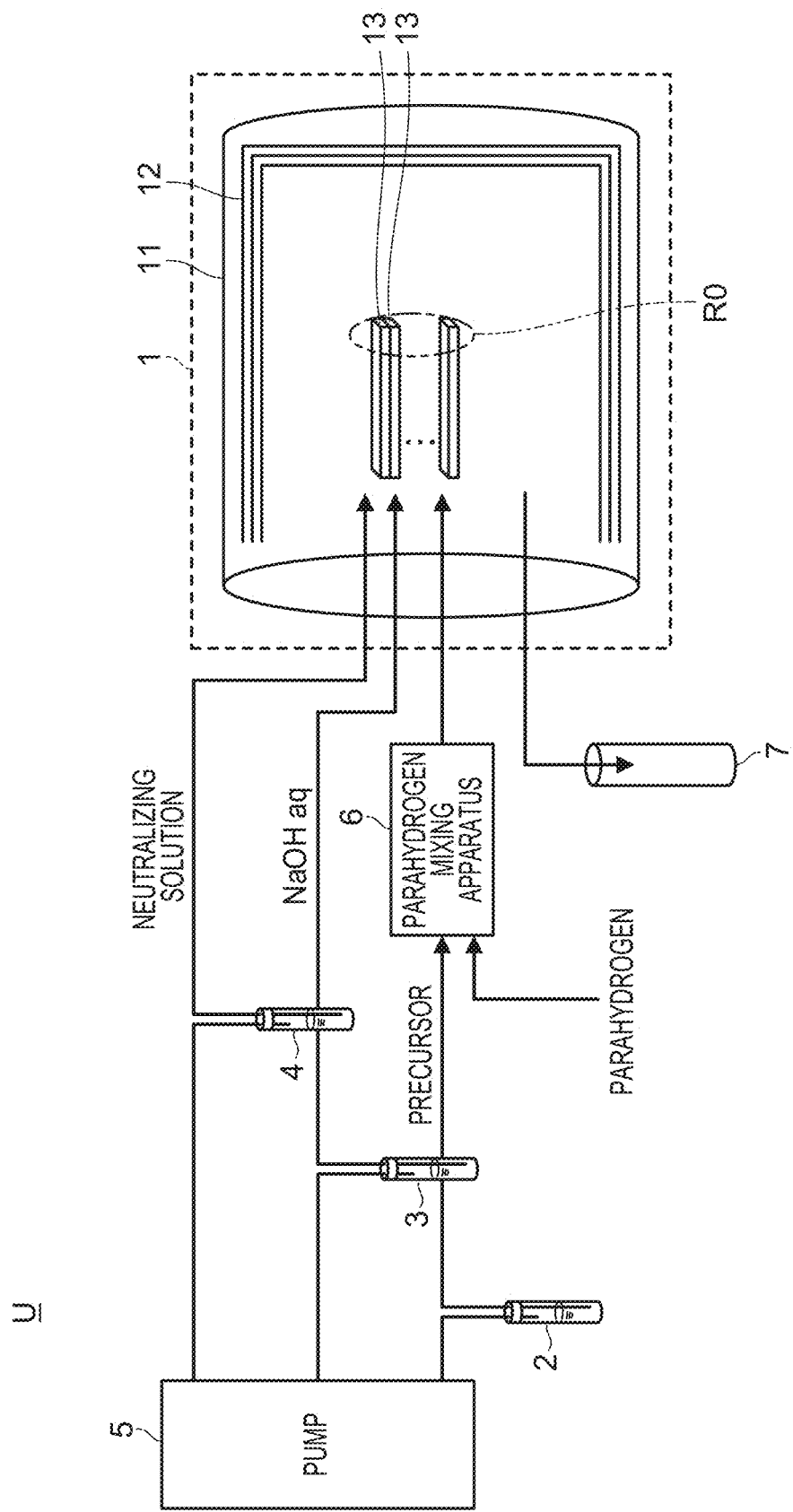
FIG. 3 is a view of an example of a general structure of a hyperpolarized substance production system according to an embodiment.

FIG. 3 illustrates an example of a general structure of hyperpolarized substance production system U.

hyperpolarized substance production system U includes polarization transfer apparatus 1, precursor supply source 2, basic solution supply source 3, neutralizing solution supply source 4, pump 5, parahydrogen mixing apparatus 6, and collection vessel 7.

Polarization transfer apparatus 1 applies a magnetic field variation according to the principle of the MFC PHIP method (hereinafter abbreviated to a "magnetic field variation") to a precursor delivered from parahydrogen mixing apparatus 6 after parahydrogen addition to induce hyperpolarization of the precursor.

Precursor supply source 2 supplies parahydrogen mixing apparatus 6 with a precursor in which hyperpolarization is to be induced. In the present embodiment, unsaturated pyruvic acid with a $^{13}C$ nucleus is used as a precursor. Precursor supply source 2 supplies parahydrogen mixing apparatus 6 with a precursor, for example, contained in a solvent (chloroform ($CHCl_3$) in the present embodiment) together with a hydrogenation catalyst (a rhodium complex in the present embodiment) for inducing a parahydrogen addition reaction in the precursor.

The precursor may be any unsaturated organic compound (an organic compound with a carbon multiple bond; the same applies hereinafter) labelled with a $^{13}C$ or $^{15}N$ nucleus. It is desirable that the $^{13}C$ or $^{15}N$ nucleus label be present within a few bonds from the carbon multiple bond.

Examples of an organic compound used as the precursor include fumaric acid and hydroxyethyl acrylate, which have a carbon multiple bond in the molecule, and pyruvic acid, lactic acid, α-ketoglutaric acid, amino acids, glutamine, organic acids, acyl compounds, and fatty acids bonded via an ester bond to a vinyl alcohol with an unsaturated bond or to 2-propynyl alcohol. More specifically, examples of organic compounds labelled with a $^{13}$C nucleus include 2-propynyl pyruvate and ethyl acrylate each having a $^{13}$C nucleus substituting for a $^{12}$C nucleus at a predetermined position. Examples of organic compounds labelled with a $^{15}$N nucleus include pyrimidine and pyridine each having a $^{15}$N nucleus substituting for a $^{14}$N nucleus.

The solvent may be an alcohol, such as methanol, or water, instead of organic solvents, such as chloroform.

Basic solution supply source 3 supplies polarization transfer apparatus 1 with a basic solution for hydrolyzing a hyperpolarized precursor. The basic solution supplied from basic solution supply source 3 is aqueous sodium hydroxide (NaOH), for example.

Neutralizing solution supply source 4 supplies polarization transfer apparatus 1 with a neutralizing solution for neutralizing a solution containing a hyperpolarized precursor. The neutralizing solution supplied by neutralizing solution supply source 4 is hydrochloric acid (HCl), for example.

Pump 5 is coupled to each of precursor supply source 2, basic solution supply source 3, and neutralizing solution supply source 4. Pump 5 constitutes a driving source for the solution delivery operation of each of precursor supply source 2, basic solution supply source 3, and neutralizing solution supply source 4. Pump 5 may use a high-pressure gas of parahydrogen, air, or an inert gas, such as nitrogen or argon, as a driving source for the solution delivery operation.

Parahydrogen mixing apparatus 6 mixes a precursor supplied from precursor supply source 2 with a parahydrogen gas. This initiates a parahydrogen addition reaction in which 1H nuclei derived from the parahydrogen are bonded to the precursor at a carbon multiple bond position of the precursor.

Parahydrogen mixing apparatus 6 may mix the precursor and the parahydrogen by any known method (see, for example, Patent Literature 1). For example, parahydrogen mixing apparatus 6 introduces a mist of a solution containing the precursor and a hydrogenation catalyst (for example, a rhodium complex) into a reaction chamber and introduces parahydrogen at a high pressure into the reaction chamber, thereby adding the parahydrogen to the precursor.

Parahydrogen mixing apparatus 6 supplies the precursor to which the parahydrogen is added (or a mixed solution of the precursor and the parahydrogen gas) to microfluidic device 13 of polarization transfer apparatus 1 at an almost constant flow rate through a tube or the like.

[Structure of Polarization Transfer Apparatus]

Next, the structure of polarization transfer apparatus 1 according to the present embodiment is described in detail with reference to FIGS. 3 to 5.

Polarization transfer apparatus 1 includes magnetic shield 11, magnetic field adjustment coil 12, and microfluidic device 13.

Figure 4C:
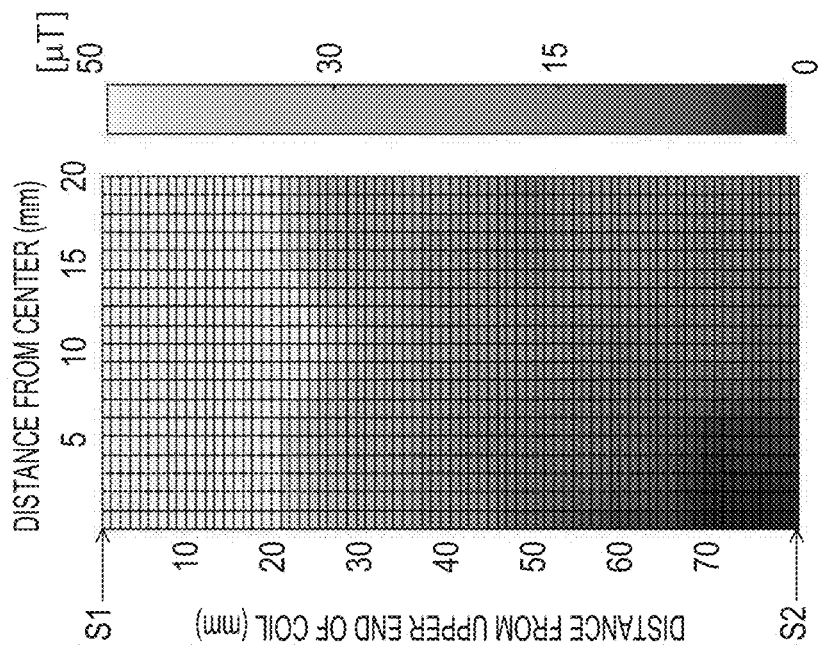
FIG. 4A to FIG. 4C are views of examples of a structure of a magnetic shield according to an embodiment (FIG. 4A), a structure of a magnetic field adjustment coil in the magnetic shield (FIG. 4B), and a magnetic distribution in the magnetic shield (FIG. 4C)
Figure 4B:
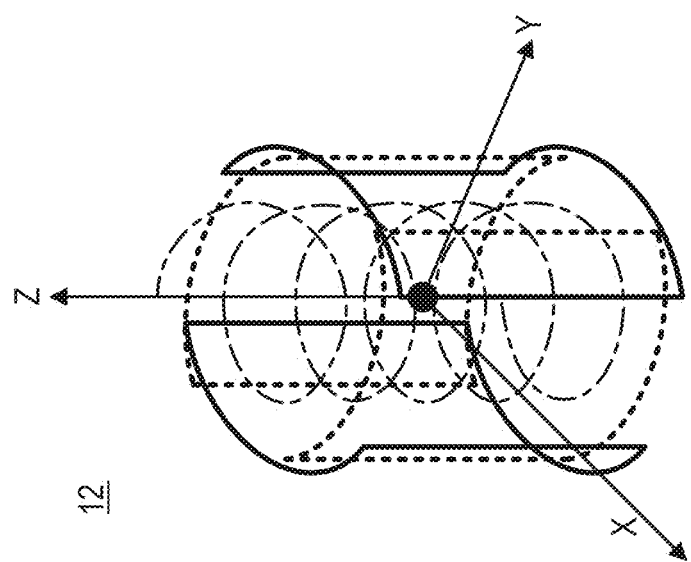
Figure 4A:
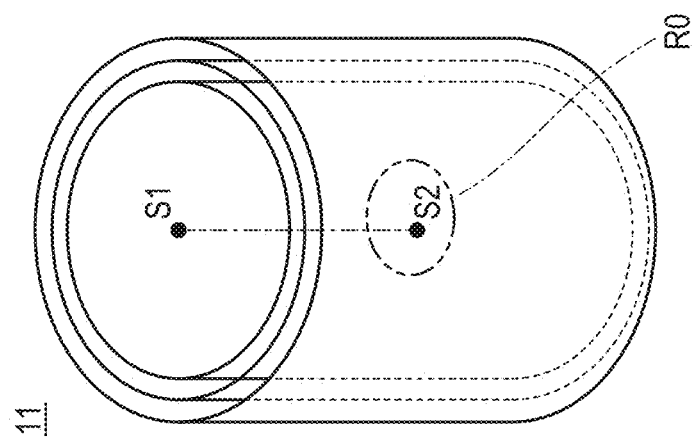

FIG. 4A to FIG. 4C show examples of the structure of magnetic shield 11 (FIG. 4A), the structure of magnetic field adjustment coil 12 in magnetic shield 11 (FIG. 4B), and a gradient magnetic field distribution in magnetic shield 11 (FIG. 4C).

FIG. 5 illustrates an example of microfluidic device 13.

Magnetic shield 11 magnetically shields the internal space from the outside. Magnetic shield 11 may be made of a material with high magnetic permeability, such as μ-metal or soft iron.

Magnetic shield 11 may have any shape, for example, an approximately cylindrical shape (see FIG. 4A).

Magnetic field adjustment coil 12 generates a gradient magnetic field including a region with a magnetic field strength of approximately zero T (a zero magnetic field) (region R0 surrounded by a dotted line in FIG. 3; hereinafter referred to as "zero magnetic field region R0") in magnetic shield 11.

Magnetic field adjustment coil 12 is more preferably a three-axis magnetic field adjustment coil surrounding zero magnetic field region R0 in three directions of the X direction, the Y direction, and the Z direction in magnetic shield 11 (see FIG. 4B). Magnetic field adjustment coil 12 is feedback controlled, for example, by a control apparatus (not shown) using a three-axis magnetic sensor (not shown) for detecting the magnetic field in magnetic shield 11 such that the magnetic field distribution does not vary in magnetic shield 11.

Zero magnetic field region R0, which may be generated by magnetic field adjustment coil 12, is typically a local region at the center of magnetic shield 11. For example, the magnetic distribution in magnetic shield 11 has a zero magnetic field in a region at almost the center of magnetic shield 11 and changes stepwise from the zero magnetic field (for example, approximately 0.1 μT) to the geomagnetism (for example, approximately 50 μT) as the magnetic distribution region is separated upward or toward the left or right wall from the central region (see FIG. 4C). The slope of the gradient magnetic field can be controlled by the current flowing into the magnetic field adjustment coil.

The state of the zero magnetic field generated by magnetic field adjustment coil 12 means a state in which the magnetic field strength in each of at least three directions of the X direction, the Y direction, and the Z direction is less than 150 nT, preferably less than 50 nT.

Microfluidic device 13 is coupled to parahydrogen mixing apparatus 6 in magnetic shield 11 and guides the precursor mixed with the parahydrogen gas in parahydrogen mixing apparatus 6 in magnetic shield 11.

Microfluidic device 13 includes substrate 13a, microchannels 13b and 13c formed in substrate 13a, and input/output ports 13d to 13h formed in substrate 13a.

Substrate 13a is a glass substrate, a stainless steel substrate, or a resin substrate, for example. Substrate 13a is typically made of a material with magnetic permeability that can be influenced by the magnetic field in magnetic shield 11.

Input/output ports 13d to 13h include first input port 13d, second input port 13e, third input port 13f, first output port 13g, and second output port 13h.

First input port 13d is coupled to parahydrogen mixing apparatus 6, for example, through a tube, preferably a tube with an inner diameter of 200 μm or less, and introduces the precursor delivered from parahydrogen mixing apparatus 6 into microfluidic device 13. Second input port 13e is coupled to basic solution supply source 3, for example, through a tube and introduces the basic solution delivered from basic solution supply source 3 into microfluidic device 13. Third input port 13f is coupled to neutralizing solution supply source 4, for example, through a tube and introduces the neutralizing solution delivered from neutralizing solution supply source 4 into microfluidic device 13.

First output port 13g is coupled to collection vessel 7, for example, through a tube and discharges the hyperpolarized precursor from microfluidic device 13. Second output port 13h discharges from microfluidic device 13, for example, an unnecessary separated liquid produced by separating only an organic solvent from the solution containing the precursor.

Microchannels 13b and 13c are microchannels for guiding the precursor in magnetic shield 11. Microchannels 13b and 13c are composed of, for example, a groove 2 mm or less in diameter and 1 mm or less in depth, preferably 500 μm or less in diameter and 250 μm or less in depth, formed in the plane of substrate 13a. The groove is covered with a cover (not shown) formed on the upper surface of substrate 13a.

Microchannels 13b and 13c extend from first input port 13d (a region near the geomagnetism in the present embodiment) and include inlet section 13b for guiding the precursor delivered from parahydrogen mixing apparatus 6 to zero magnetic field region R0 and outlet section 13c that is formed continuously with inlet section 13b and that guides the precursor guided to zero magnetic field region R0 by inlet section 13b to first output port 13g (a region near the geomagnetism in the present embodiment).

Microchannels 13b and 13c are formed to apply a magnetic field variation according to the principle of the MFC PHIP method to the precursor flowing through microchannels 13b and 13c to induce hyperpolarization of the precursor. Typically, inlet section 13b guides the precursor in magnetic shield 11 such that the strength of the magnetic field acting on the precursor flowing through inlet section 13b decreases rapidly and monotonically from approximately 1 μT to the zero magnetic field. Outlet section 13c guides the precursor in magnetic shield 11 such that the strength of the magnetic field acting on the precursor flowing through outlet section 13c increases gradually and monotonically from the zero magnetic field to approximately 1 μT.

Microchannels 13b and 13c are designed in accordance with the magnetic field distribution in magnetic shield 11. Typically, inlet section 13b linearly guides the precursor along the gradient magnetic field from position R1 of approximately 1 μT to zero magnetic field region R0 in magnetic shield 11, and outlet section 13c guides the precursor through a detour (that is, meanderingly) along the gradient magnetic field from zero magnetic field region R0 to position R1 of approximately 1 μT in magnetic shield 11. This rapidly (that is, non-adiabatically) changes the magnetic field acting on the precursor from approximately 1 μT to the zero magnetic field and then slowly (that is, adiabatically) from the zero magnetic field to approximately 1 μT.

In microchannels 13b and 13c, a region in which the strength of the magnetic field acting on the precursor is between approximately 1 μT and the zero magnetic field (L1 region in FIG. 5) corresponds to polarization transfer induction region L1 that has a particular influence on the nuclear spin polarization ratio of polarization transfer. Thus, only the magnetic field variation between the zero magnetic field and approximately 1 μT is described here. It should be noted that inlet section 13b preferably guides the precursor in magnetic shield 11 such that the strength of the magnetic field acting on the precursor flowing through inlet section 13b decreases rapidly and monotonically from the geomagnetism to the zero magnetic field. Outlet section 13c guides the precursor in magnetic shield 11 such that the strength of the magnetic field acting on the precursor flowing through outlet section 13c increases gradually and monotonically from the zero magnetic field to approximately 1 μT and then increases rapidly and monotonically from approximately 1 μT to the geomagnetism.

The effects of using the microchannel as a channel for guiding a precursor in magnetic shield 11 on the induction of hyperpolarization of the precursor are described below with reference to FIG. 6.

Figure 6:
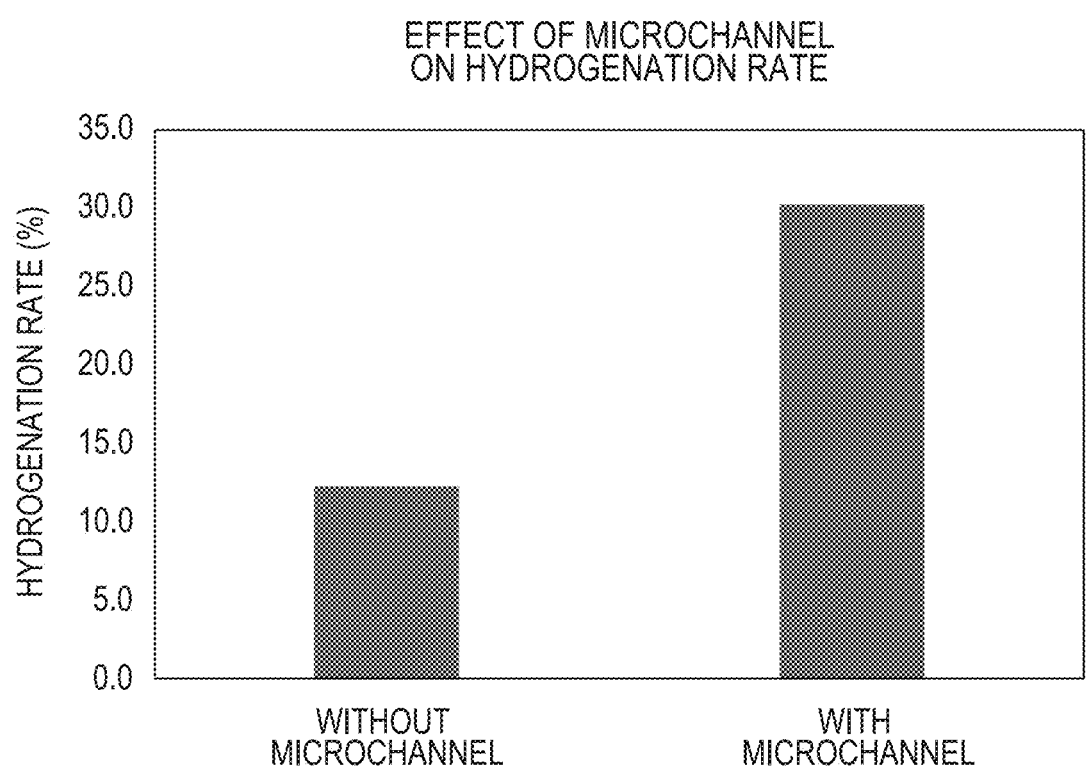
FIG. 6 is a graph of a change in the hydrogenation rate of a precursor due to a microchannel.

FIG. 6 is a graph of a change in the hydrogenation rate of a precursor due to the microchannel. The hydrogenation rate of the precursor illustrated in FIG. 6 represents a hydrogenation rate measured when the precursor mixed with the parahydrogen discharged from parahydrogen mixing apparatus 6 or the precursor to which the parahydrogen is added is guided from the geomagnetism position to the zero magnetic field position in magnetic shield 11 (the hydrogenation rate of the precursor measured before the polarization transfer of the precursor in the present embodiment).

The graph of "without microchannel" in FIG. 6 represents the hydrogenation rate of the precursor when a tube according to the related art is used as a channel for guiding a precursor, and the graph of "with microchannel" in FIG. 6 represents the hydrogenation rate of the precursor when microfluidic device 13 according to the present embodiment is used as a channel for guiding the precursor.

According to the findings of the present inventors, the use of a hose to guide the precursor in magnetic shield 11 cannot sufficiently induce hyperpolarization of the precursor. This is probably because the use of the hose takes a long reaction time for guiding in the magnetic shield after the parahydrogen addition reaction is completed in parahydrogen mixing apparatus 6, and 1H hyperpolarization due to parahydrogen added immediately after the mixing is rapidly attenuated by magnetic relaxation (time constant: approximately 30 seconds) depending on a solvent present around the precursor during the hydrogen addition reaction or before guiding to zero magnetic field region R0 in magnetic shield 11.

By contrast, in microfluidic device 13 according to the present embodiment, even if a precursor to which parahydrogen is not added is discharged from parahydrogen mixing apparatus 6, guiding the precursor through microchannels (inlet section 13b and outlet section 13c) enables the addition reaction of the mixed parahydrogen to be rapidly completed while the precursor flows through inlet section 13b. This is because the reaction time of a chemical reaction depending on molecular diffusion is proportional to the square of diffusion length, and the parahydrogen addition reaction proceeds efficiently in a microchannel where the diffusion length is hundreds of micrometers or less. This can significantly decrease the time (τ1+τ2) from the start of mixing parahydrogen and the precursor to the guiding to zero magnetic field region R0 after the completion of the hydrogen addition reaction and consequently reduce the loss of the polarization ratio due to the magnetic relaxation of hyperpolarized 1H nuclei derived from the parahydrogen before polarization transfer from 1H nuclei to a $^{13}$C nucleus is induced.

In the inside of microfluidic device 13 according to the present embodiment, a very high ratio of the wall surface area of the microchannel to the unit volume occupied by the precursor can result in relatively reduced magnetic relaxation caused by the solvent present around the precursor. This can maintain a high polarization ratio of the 1H nuclei derived from the parahydrogen when zero magnetic field region R0 is reached, and can induce high hyperpolarization of the $^{13}$C nucleus by the subsequent polarization transfer to the $^{13}$C nucleus.

In addition to polarization transfer induction region L1, which induces hyperpolarization of the precursor, microfluidic device 13 according to the present embodiment has a region for performing a chemical process on the hyperpolarized precursor located downstream of polarization transfer induction region L1. This immediately changes the solution of the hyperpolarized precursor to be adapted to a reagent for NMR spectroscopy (for example, a contrast medium or tracer for MRI diagnosis).

More specifically, the region for performing a chemical process on the hyperpolarized precursor is formed downstream of polarization transfer induction region L1 in outlet section 13c (that is, in a region in which the strength of the magnetic field acting on the precursor is approximately 1 µT or more).

Outlet section 13c has first mixing section 13ca, second mixing section 13cb, and separation section 13cc located downstream of polarization transfer induction region L1. Outlet section 13c discharges the hyperpolarized precursor to first output port 13g through first mixing section 13ca, second mixing section 13cb, and separation section 13cc.

First mixing section 13ca mixes a solution containing the hyperpolarized precursor with the basic solution for hydrolyzing the precursor. The basic solution is a solution delivered from basic solution supply source 3 and is supplied to first mixing section 13ca via second input port 13e.

After the basic solution is mixed in first mixing section 13ca, the hyperpolarized precursor is hydrolyzed while being guided in outlet section 13c. A bond portion of the hyperpolarized precursor to which parahydrogen is added (for example, an alcohol side chain of a carboxylate to which the parahydrogen is added) is removed by hydrolysis, and the hyperpolarized precursor is converted into a carboxylic acid. In the present embodiment, hyperpolarized allyl pyruvate (CH3—CO—C*O—O—CH2—CH=CH2) (wherein * denotes a $^{13}C$ nucleus label; the same applies hereinafter) is hydrolyzed by the basic solution (sodium hydroxide in the present embodiment) into sodium pyruvate (CH3—CO—C*O—ONa) and allyl alcohol (CH2=CH-CH2-OH).

In the microchannel, viscous force is typically more dominant than inertial force, and the liquid flow is a laminar flow. Thus, an organic solvent (chloroform in the present embodiment) and an aqueous solvent (sodium chloride in the present embodiment) flow through outlet section 13c without being mixed with each other, and the molecular transport of the hyperpolarized precursor between these solvents depends only on molecular diffusion. Thus, the hyperpolarized precursor in the organic solvent moves gradually to the aqueous solvent while being hydrolyzed at the interface between the organic solvent and the aqueous solvent. In particular, the hyperpolarized precursor sodium pyruvate (CH3—CO—C*O—ONa) according to the present embodiment has a hydrophilic carboxy group and therefore moves easily to the aqueous solvent.

Second mixing section 13cb mixes the solution containing the hyperpolarized precursor with the neutralizing solution for neutralizing the solution. The neutralizing solution is a solution delivered from neutralizing solution supply source 4 and is supplied to second mixing section 13cb via third input port 13f.

After the neutralizing solution is mixed in second mixing section 13cb, the hyperpolarized precursor is neutralized while being guided in outlet section 13c. In the present embodiment, the hyperpolarized sodium pyruvate (CH3-CO—C*O—ONa) is neutralized by a neutralizing solution (hydrochloric acid in the present embodiment) while being guided in outlet section 13c and is converted into hyperpolarized pyruvic acid (CH3-CO—C*O—OH).

Separation section 13cc separates the organic solvent (chloroform in the present embodiment) from the solution containing the hyperpolarized precursor in a region downstream of first mixing section 13ca. In the region downstream of first mixing section 13ca, the precursor has moved from the organic solvent (chloroform in the present embodiment) to the aqueous solvent (aqueous sodium hydroxide in the present embodiment), and at this point the organic solvent is a waste fluid not containing the hyperpolarized precursor. Thus, microfluidic device 13 separates the organic solvent from the solvent containing the precursor in separation section 13cc and discharges the organic solvent to second output port 13h.

A hydrogenation catalyst (a rhodium catalyst in the present embodiment) in the organic solvent is poorly soluble in water, does not diffuse from the organic solvent to the aqueous solvent, and is discharged to second output port 13h together with the organic solvent.

In this manner, the hyperpolarized substance from which impurities are removed is discharged from first output port 13g and is collected in collection vessel 7. The hyperpolarized substance is then used as a reagent for NMR spectroscopy (for example, a contrast medium or tracer for MRI diagnosis).

Polarization transfer apparatus 1 according to the present embodiment includes a plurality of microfluidic devices 13 with the structure described above to increase the amount of hyperpolarized substance produced by polarization transfer apparatus 1.

[Design of Microfluidic Device]

Next, an example of a method of designing microfluidic device 13 of polarization transfer apparatus 1 is described in detail with reference to FIGS. 7 to 10.

Considering the principle of polarization transfer from 1H nuclei to a $^{13}C$ nucleus in the MFC PHIP method, an optimum magnetic field variation pattern to induce more polarization transfer in a precursor depends on the chemical structure of the precursor and the position in the precursor at which parahydrogen is added.

From such a perspective, it is desirable that microfluidic device 13 be designed on the basis of the chemical structure of the precursor and the position in the precursor at which parahydrogen is added. An optimum magnetic field variation pattern applied to the precursor can typically be calculated using quantum statistical mechanical simulation.

The design parameters of microfluidic device 13 include the flow rate of a precursor flowing through inlet section 13b and outlet section 13c, the groove diameter of inlet section 13b and outlet section 13c, and the meandering of outlet section 13c, for example.

The factors for determining the degree of polarization transfer from 1H nuclei to a $^{13}C$ nucleus in the magnetic field variation pattern include time $\tau 1$ of changing from the geomagnetism to approximately 1 µT, time $\tau 2$ of changing from approximately 1 µT to the zero magnetic field, the waiting time in the zero magnetic field state following time $\tau 2$, time $\tau 3$ of changing from the zero magnetic field to approximately 1 µT, and time $\tau 4$ of changing from approximately 1 µT to the geomagnetism.

According to the empirical rule based on the quantum statistical mechanical simulation, however, the duration of time $\tau 3+\tau 4$ (in particular, the duration $\tau 3$ from the zero magnetic field to approximately 1 µT) has a greater influence on the degree of polarization transfer from 1H nuclei to a $^{13}C$ nucleus than other factors. It is therefore sufficient if the duration of time $\tau 3+\tau 4$ can be optimized.

A method for determining an optimum magnetic field variation pattern using the quantum statistical mechanical simulation is described below.

First, in a precursor after parahydrogen addition, the initial state of the spin of 1H nuclei derived from the parahydrogen is expressed by the density matrix a as in expression 1. Expression 1 is an expression method by a product operator method.

[1]

$$\sigma_{earth} = \text{(Expression 1)}$$
$$\frac{E}{4} - I_z^H I_z^{H'} - \overline{a}_1^{earth}(I_x^H I_x^{H'} + I_y^H I_y^{H'}) - \overline{a}_4^{earth}(I_z^H I_z^X - I_z^{H'} I_z^X)$$

The first term represents a unit operator, the second and third terms represent a spin operator of H-H', and the fourth term represents a spin operator of a spin-spin interaction component of each of H-13C and H'-13C nuclei. For an n spin system, expression 1 is a 2n-order square matrix.

Next, in the precursor after the parahydrogen addition, the spin component of the 1H nuclei derived from the parahydrogen, the spin component of the $^{13}$C nucleus, and the spin component of magnetic coupling (also referred to as J coupling) thereof are expressed by Hamiltonian H as represented by expression 2. Hamiltonian Hs of various magnetic field variation patterns are prepared.

[2]

$$H = -v_H(I_z^H + I_z^{H'}) - v_C I_z^X + J_{AA'}(\hat{I}_x^H \hat{I}_x^{H'} + \hat{I}_y^H \hat{I}_y^{H'} + \hat{I}_z^H \hat{I}_z^{H'}) + J_{AX}(\hat{I}_x^H \hat{I}_x^H + \hat{I}_y^H \hat{I}_y^H + \hat{I}_z^H \hat{I}_z^H) + J_{A'X}(\hat{I}_x^{H'} \hat{I}_x^H + \hat{I}_y^{H'} \hat{I}_y^H + \hat{I}_z^{H'} \hat{I}_z^H)$$
(Expression 2)

In expression 2, the first term (term with frequency vH) represents the spin component of parahydrogen due to the magnetic field in the geomagnetic direction, the second term (term with frequency vC) represents the spin component of the $^{13}$C nucleus due to the magnetic field in the geomagnetic direction, the third term (term with J coupling coefficient JAA') represents the spin-spin interaction component between H-H', the fourth term (term with J coupling coefficient JAX) represents the spin-spin interaction component between H-13C, and the fifth term (term with J coupling coefficient JA'X) represents the spin-spin interaction component between H'-13C.

In the present embodiment, in expression 2, various magnetic field variation patterns are input to vH of the first term (=gyromagnetic ratio $\gamma_H$ of $^1$H nucleus×magnetic field B/2π in the geomagnetic direction) and $v_C$ of the second term (=gyromagnetic ratio $\gamma_C$ of $^{13}$C nucleus×magnetic field B/2π in the geomagnetic direction) to prepare Hamiltonian Hs of various magnetic field variation patterns. In the present embodiment, only the duration of time τ3+τ4 of changing from the zero magnetic field to the geomagnetism in the magnetic field variation pattern is changed.

Next, the Hamiltonian H (see expression 2) is applied to the density matrix a (see expression 1) to calculate the expected value (=trace) of the nuclear spin polarization ratio of the $^{13}$C nucleus (that is, the degree of polarization transfer from the $^1$H nuclei to the $^{13}$C nucleus) when the magnetic field variation is applied to the precursor, as represented by expression 3. A temporal variation in the nuclear spin polarization ratio of the $^{13C}$ nucleus can be calculated as the time evolution of the density matrix a using the well-known Liouville equation (dρ/dt=i/h [σ, H]) or the like.

[3]

$$\text{trace}(I_z^X, \sigma_{final}) \quad \text{(Expression 3)}$$

Izx denotes the spin operator of the $^{13}$C nucleus.

In this manner, the expected value of the nuclear spin polarization ratio of the $^{13}$C nucleus is calculated for various magnetic field variation patterns. Then, a magnetic field variation pattern with the maximum expected value of the nuclear spin polarization ratio of the $^{13}$C nucleus is selected as an optimum magnetic field variation pattern.

Figure 7:
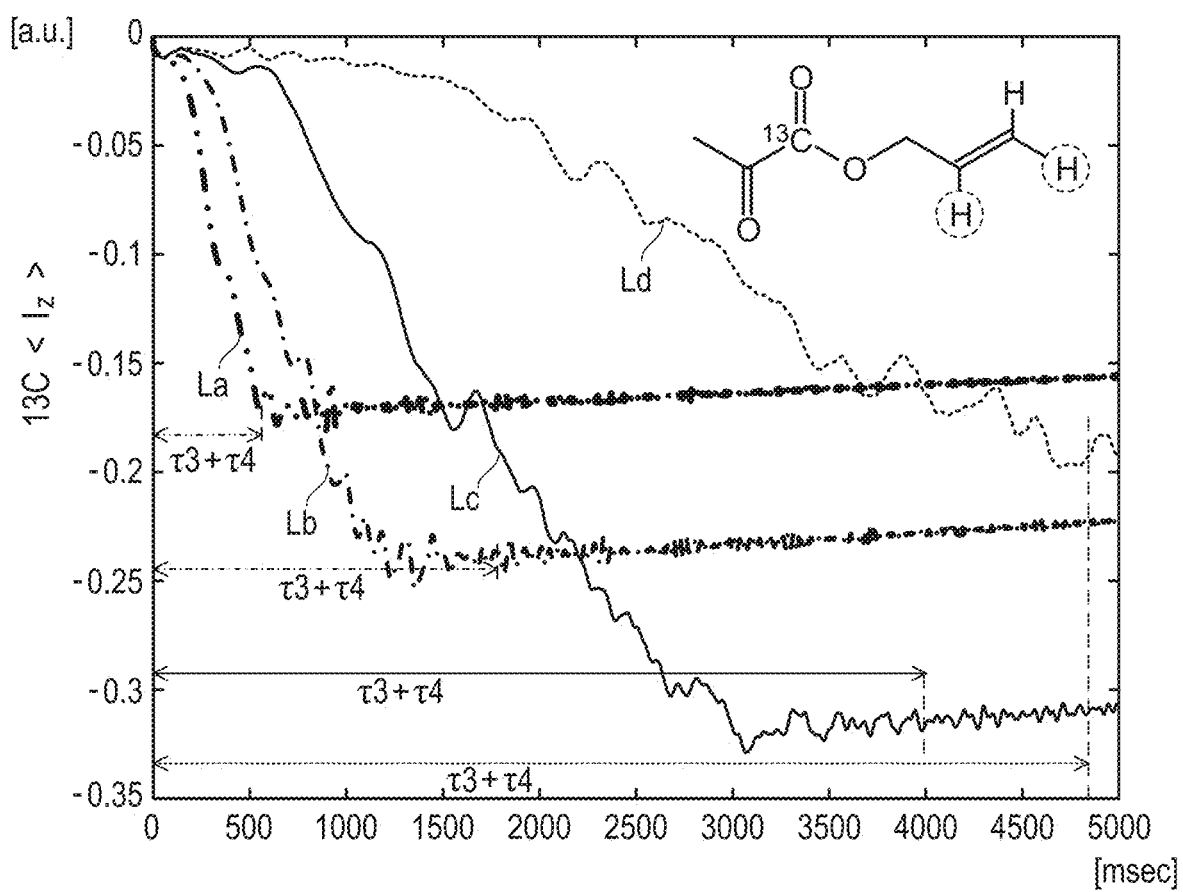
FIG. 7 is a graph of an example of a simulation result of a quantum statistical mechanical simulation according to an embodiment.

FIG. 7 is a graph of an example of a simulation result of a quantum statistical mechanical simulation according to the present embodiment.

Each of the graphs La to Ld in FIG. 7 represents a temporal variation in the nuclear spin polarization ratio of the $^{13}$C nucleus in the precursor calculated using expression 3 for each of a plurality of magnetic field variation patterns to be applied to the precursor. In FIG. 7, the vertical axis represents the expected value (=trace) of the nuclear spin polarization ratio of the $^{13}$C nucleus at each timing. The horizontal axis represents the elapsed time [ms] from the timing at which the magnetic field strength start to increase from the zero magnetic field in the magnetic field variation pattern.

In each of the graphs La to Ld in FIG. 7, as described below, only the duration of time τ3+τ4 of changing from the zero magnetic field to the geomagnetism (that is, the rate of change in the strength of the magnetic field applied to the precursor) is different among the magnetic field variation patterns applied to the precursor.

Graph La (dash-dot-dot line): the duration of time τ3+τ4 is approximately 500 ms.

Graph Lb (dash-dotted line): the duration of time τ3+τ4 is approximately 1500 ms.

Graph Lc (solid line): the duration of time τ3+τ4 is approximately 4000 ms.

Graph Ld (dotted line): the duration of time τ3+τ4 is approximately 5000 ms.

FIG. 7 shows that the absolute value of the nuclear spin polarization ratio of the $^{13}$C nucleus is highest in the graph Lc. Thus, in this case, microfluidic device 13 is designed such that the magnetic field variation pattern of the graph Lc (solid line, the duration of time τ3+τ4: approximately 4000 ms) is applied to the precursor flowing through outlet section 13c.

Figure 8:
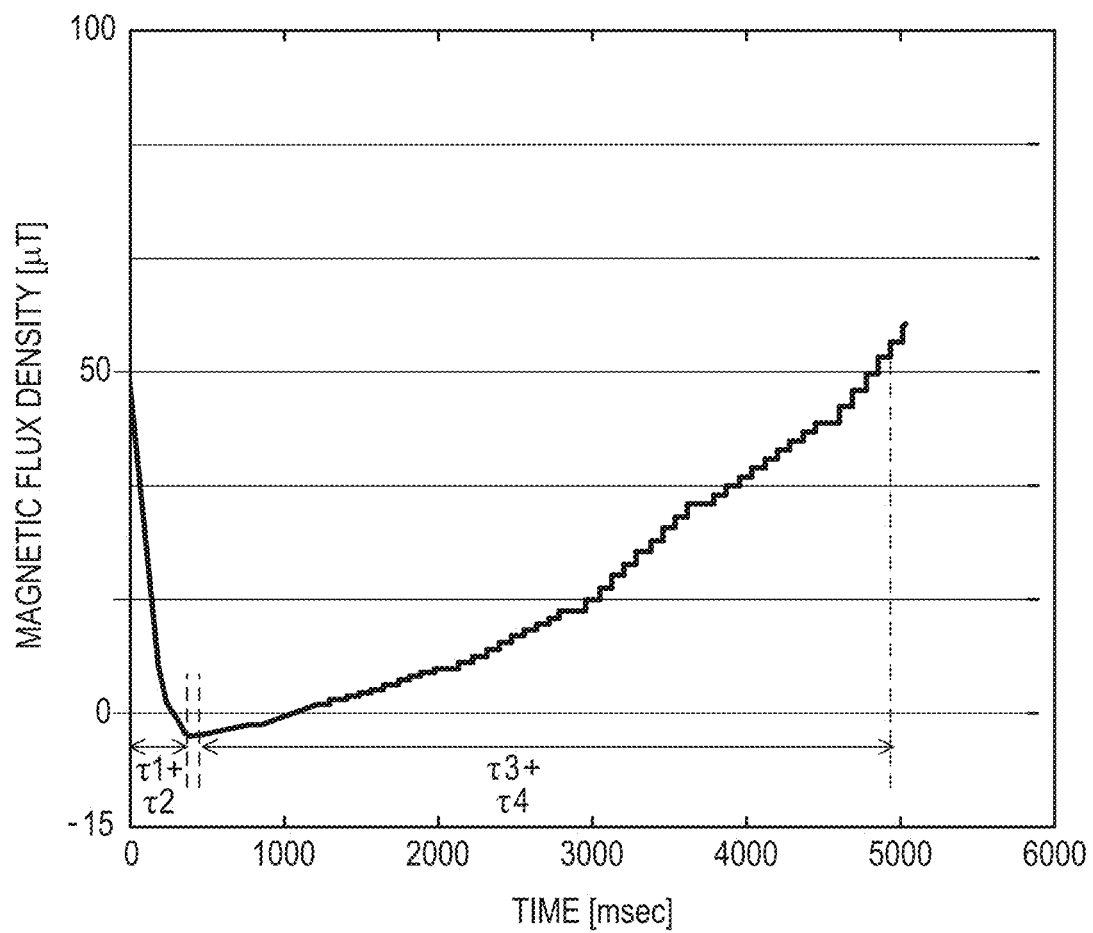
FIG. 8 is a graph of a magnetic field variation pattern applied to a precursor passing through a microfluidic device designed on the basis of the simulation result of FIG. 7.

FIG. 8 is a graph of a magnetic field variation pattern applied to a precursor passing through microfluidic device 13 designed on the basis of the simulation result of FIG. 7. In FIG. 8, the horizontal axis represents the flowing time [ms] of a precursor from the timing at which the precursor reaches first input port 13d of microfluidic device 13. The vertical axis in FIG. 8 represents the strength of the magnetic field [μT] acting on the precursor at this timing. The negative magnetic field strength on the vertical axis in FIG. 8 represents a state in which the direction of the magnetic field is reversed.

Thus, in this case, the flow rate of the precursor flowing through inlet section 13b and outlet section 13c of microfluidic device 13, the groove diameter of inlet section 13b and outlet section 13c, and the meandering of outlet section 13c may be designed in consideration of the magnetic field distribution in magnetic shield 11 to receive the magnetic field variation pattern illustrated in FIG. 8. FIG. 5 illustrates microfluidic device 13 designed to receive the magnetic field variation pattern.

Figure 9:
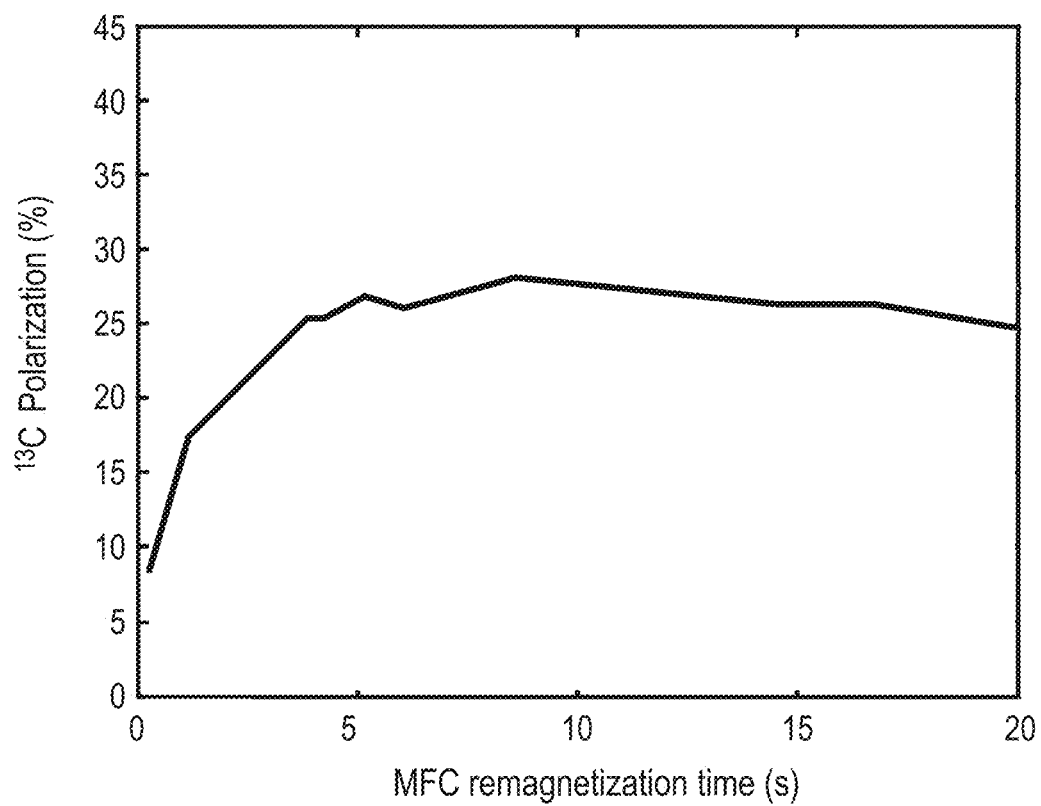
FIG. 9 is a graph of a temporal variation in the nuclear spin polarization ratio of a $^{13}C$ nucleus when a magnetic field variation is applied to $[1-^{13}C]$ allyl pyruvate after parahydrogen addition in a polarization transfer apparatus according to an embodiment.

FIG. 9 is a graph of a temporal variation in the nuclear spin polarization ratio of a $^{13}$C nucleus when a magnetic field variation is applied to [1-$^{13}$C] allyl pyruvate after parahydrogen addition in polarization transfer apparatus 1 according to the present embodiment. The temporal variation in the nuclear spin polarization ratio of the $^{13}$C nucleus illustrated in FIG. 9 is calculated by quantum statistical mechanical simulation in consideration of the attenuation rate of the polarization ratio due to magnetic relaxation.

Figure 10:
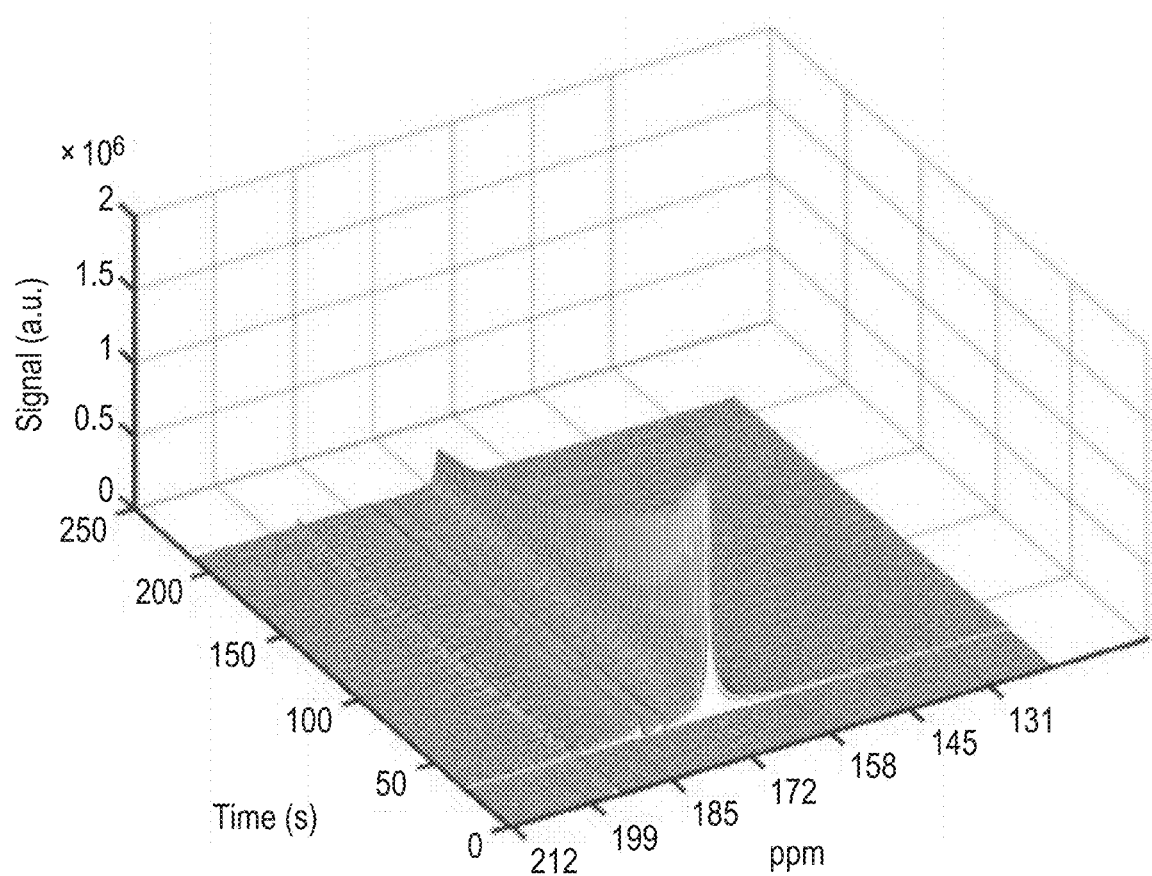
FIG. 10 is a $^{13}C$ NMR spectrum of hyperpolarized $[1-^{13}C]$ pyruvate excited with a polarization transfer apparatus according to an embodiment and measured with a 1.5-T MRI apparatus.

FIG. 10 is a $^{13}$C NMR spectrum of hyperpolarized [1-$^{13}$C] pyruvate produced by polarization transfer apparatus 1 according to the present embodiment and measured with a 1.5-T MRI apparatus.

Figure 11:
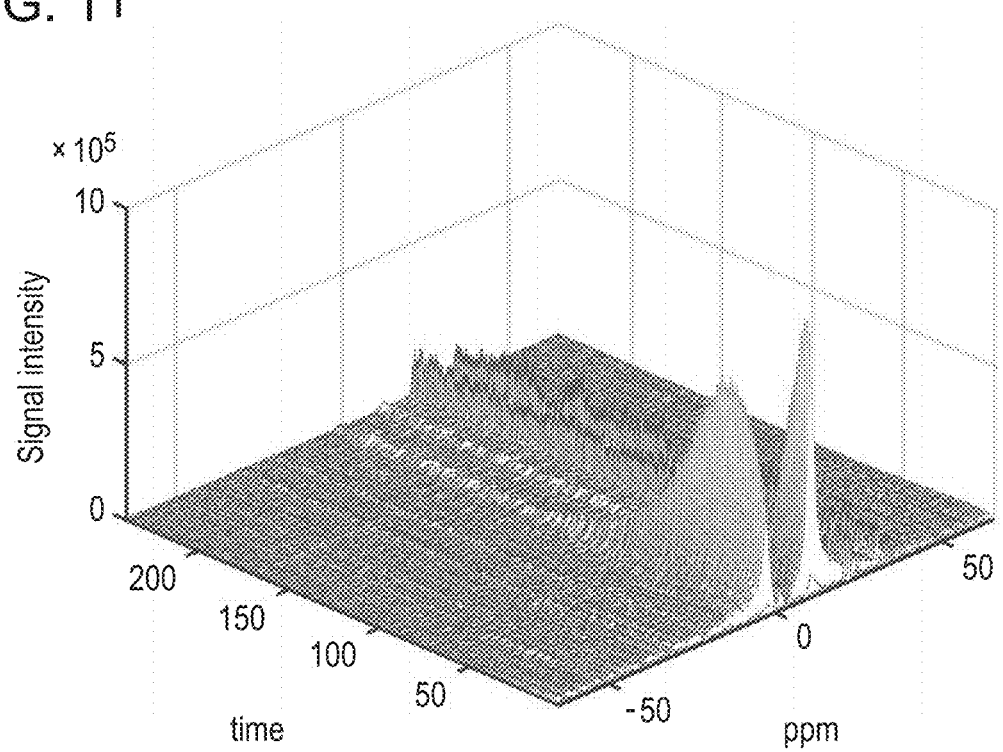
FIG. 11 is a 13C NMR spectrum measured by observing a reaction with tumor homogenate using the hyperpolarized $[1-^{13}C]$ pyruvate of FIG. 10 as a metabolic probe.

FIG. 11 is a $^{13}$C NMR spectrum measured by observing the reaction state with tumor homogenate using the hyperpolarized [1-$^{13}$C] pyruvate of FIG. 10 as a metabolic probe. Pyruvic acid in normal tissues is metabolized to water and carbon dioxide mainly by oxidative phosphorylation in mitochondria. In cancer tissues, however, repression of pyruvate dehydrogenase and activation of lactate dehydrogenase enhance metabolic flux to lactate.

FIG. 11 shows that a peak corresponding to lactate is clearly observed in the $^{13}$C NMR spectrum. This means that the process in which pyruvic acid is metabolized and lactate is generated in a cancer tissue can be measured in real time by using the hyperpolarized [1-$^{13}$C] pyruvate produced by polarization transfer apparatus 1 according to the present embodiment as a metabolic probe.

Figure 12:
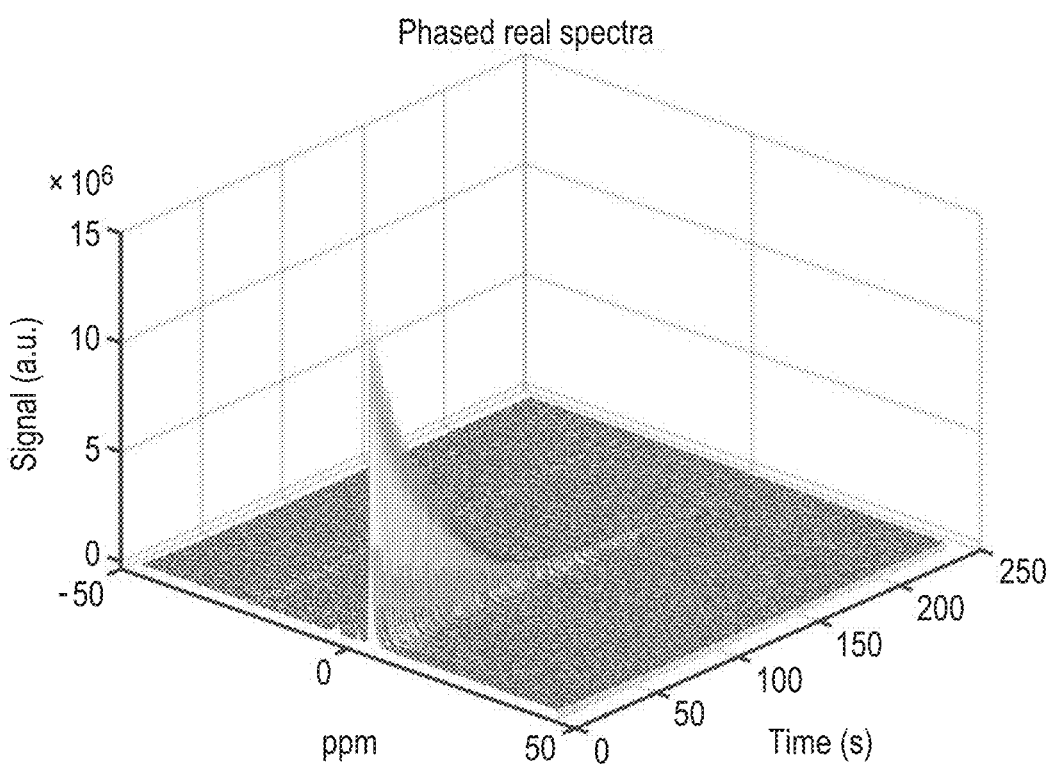
FIG. 12 is a $^{13}C$ NMR spectrum of hyperpolarized $[1-^{13}C]$ fumarate excited with a polarization transfer apparatus according to an embodiment and measured with a 1.5-T MRI apparatus.

FIG. 12 is a graph of hyperpolarization when fumaric acid is used as a precursor instead of pyruvic acid in polarization transfer apparatus 1 according to the present embodiment. FIG. 12 shows a $^{13}$C NMR spectrum of hyperpolarized [1-$^{13}$C] fumarate measured by a 1.5-T MRI apparatus. FIG. 12 shows that a hyperpolarized substance with a high nuclear spin polarization ratio can also be produced using fumaric acid as a precursor in polarization transfer apparatus 1 according to the present embodiment.

As described above, it is desirable that microfluidic device 13 be designed using quantum statistical mechanical simulation for each of precursor substances with different chemical structures and for each of different positions in a precursor to which parahydrogen is added.

It should be noted that a common general trend for inducing polarization transfer has been established from findings based on quantum statistical mechanical simulation of various precursors and from the related art. Microfluidic device 13 may therefore be designed at least in accordance with the general trend.

More specifically, for example, inlet section 13b is designed such that the time to decrease the magnetic field strength applied to a precursor from approximately 1 µT to the zero magnetic field is less than 200 milliseconds, preferably less than 50 milliseconds. In other words, inlet section 13b is designed such that the time for a precursor to flow from position R1 of approximately 1 µT to zero magnetic field region R0 in magnetic shield 11 is less than 200 milliseconds, preferably less than 50 milliseconds.

For example, inlet section 13b may be configured such that after a precursor is guided to zero magnetic field region R0 the precursor is held for a predetermined time (for example, approximately 50 milliseconds) in zero magnetic field region R0. However, the holding time in the zero magnetic field has a small influence on the nuclear spin polarization ratio. In designing microfluidic device 13, therefore, such a holding time may or may not be taken.

For example, outlet section 13c is designed such that the time to return the magnetic field strength applied to a precursor from the zero magnetic field to approximately 1 µT ranges from 0.5 to 20 seconds, for example. In other words, outlet section 13c is designed such that the time for a precursor to flow from zero magnetic field region R0 to position R1 of approximately 1 µT in magnetic shield 11 ranges from 0.5 to 20 seconds.

The optimum time to return from the zero magnetic field to approximately 1 µT depends particularly on the substance of the precursor. Thus, it is desirable that outlet section 13c be designed for each precursor substance (that is, for each substance of the precursor and for each position in the precursor to which parahydrogen is added). For example, when the precursor is 2-propynyl pyruvate, it is desirable that the time to return from the zero magnetic field to approximately 1 µT range from 4.5 to 5.5 seconds. For example, when the precursor is ethyl acrylate, it is desirable that the time to return from the zero magnetic field to approximately 1 µT range from 1.0 to 2.0 seconds.

Although only a design in polarization transfer induction region L1 (the region between approximately 1 µT and the zero magnetic field) of inlet section 13b and outlet section 13c has been described, it is also possible to optimize the whole process during the transit time of inlet section 13b guiding a precursor from the geomagnetic region to zero magnetic field region R0 and during the transit time of outlet section 13c guiding the precursor from zero magnetic field region R0 to the geomagnetic region.

Furthermore, a plurality of microfluidic devices 13 different only in the time to return from the zero magnetic field to approximately 1 µT may be prepared in consideration of general characteristics common to precursors, and microfluidic device 13 to be used may be selected according to the precursor to be used.

[Advantages]

Thus, polarization transfer apparatus 1 according to the present embodiment can apply an ideal magnetic field variation to a precursor to induce hyperpolarization of a $^{13}$C or $^{15}$N nucleus of the precursor without controlling the magnetic field variation while microfluidic device 13 guides the precursor. Furthermore, polarization transfer apparatus 1 according to the present embodiment can accelerate the addition reaction of parahydrogen to a precursor while microfluidic device 13 guides the precursor. This enables stable production of a hyperpolarized substance with a high nuclear spin polarization ratio.

Furthermore, in polarization transfer apparatus 1 according to the present embodiment, microfluidic device 13 can consistently perform the polarization transfer process and the chemical process. This can reduce the time between the induction of hyperpolarization of a precursor and its use as a reagent for NMR spectroscopy (for example, a contrast medium or tracer for MRI diagnosis). The hyperpolarized state of a precursor lasts only for a short time (for example, approximately 5 minutes). It is therefore practically very useful to reduce the time between the induction of hyperpolarization of a precursor and its use as a reagent for NMR spectroscopy.

Modified Example 1

Figure 13:
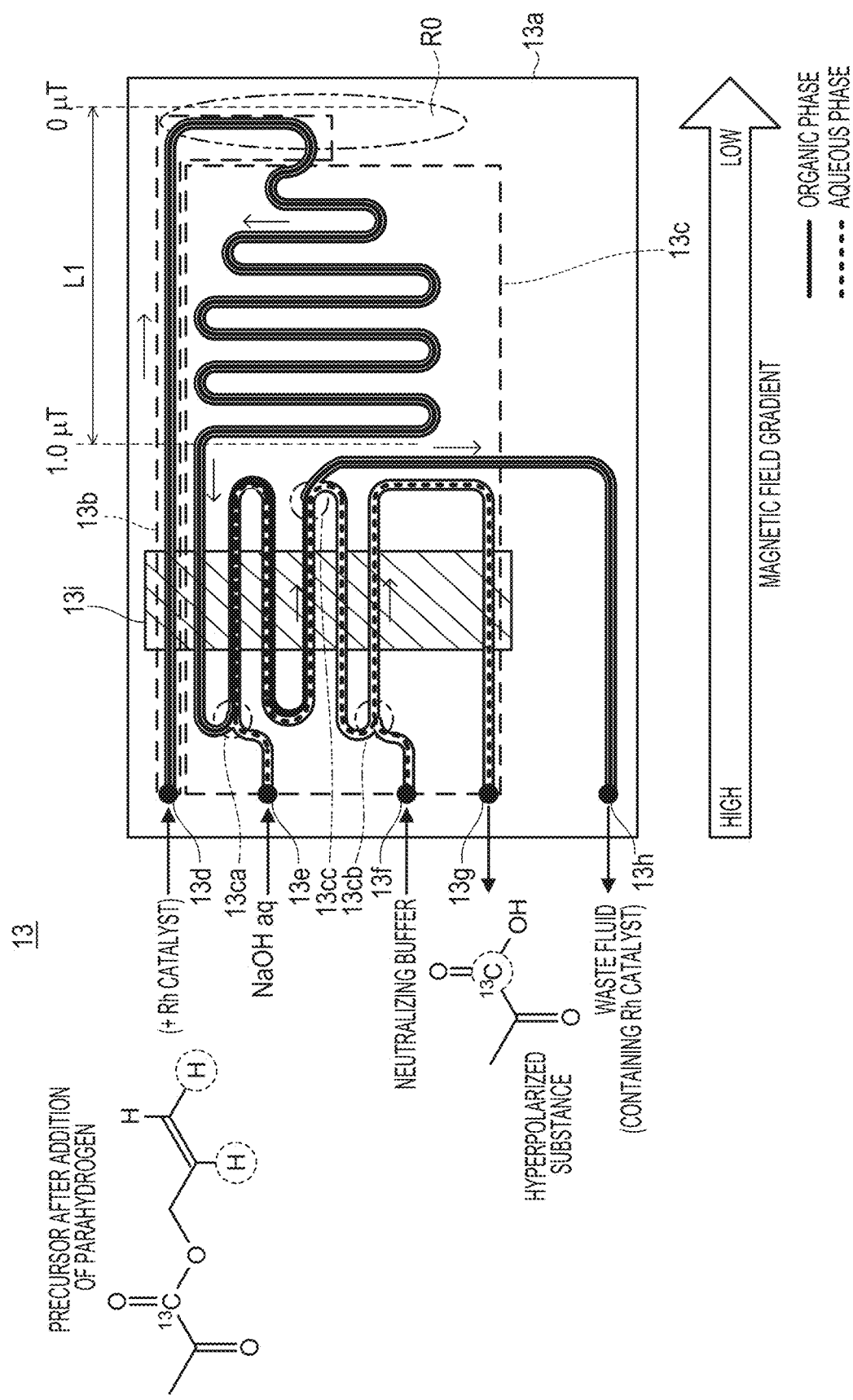
FIG. 13 is a view of a structure of a microfluidic device according to Modified Example 1.

FIG. 13 illustrates the structure of microfluidic device 13 according to Modified Example 1.

Microfluidic device 13 according to the present modified example has magnetic film 13i for adjusting the magnetic field gradient in the flow direction of a precursor and is different in this respect from microfluidic device 13 according to the above embodiment.

In microfluidic device 13 according to the above embodiment, due to a small magnetic field variation per unit distance in magnetic shield 11, the speed of the magnetic field variation applied to a precursor flowing through microfluidic device 13 may not be suitable to induce hyperpolarization of the precursor.

Magnetic film 13i is provided for such a case to adjust the magnetic field gradient in the flow direction of a precursor in microfluidic device 13 (particularly polarization transfer induction region L1). For example, magnetic film 13*i* is provided to cover the upper surface of substrate 13*a* of microfluidic device 13.

It is desirable that magnetic film 13*i* be an anisotropic magnetic film that generates a magnetic field only in the extending direction of inlet section 13*b* and outlet section 13*c* (in the left-right direction in FIG. 13). Magnetic film 13*i* is formed of an iron material, for example. Magnetic film 13*i* may also be an isotropic magnetic film.

Thus, microfluidic device 13 according to the present modified example can more optimally set the magnetic field variation applied to a precursor flowing through microfluidic device 13 to induce hyperpolarization of the precursor.

Modified Example 2

Figure 14:
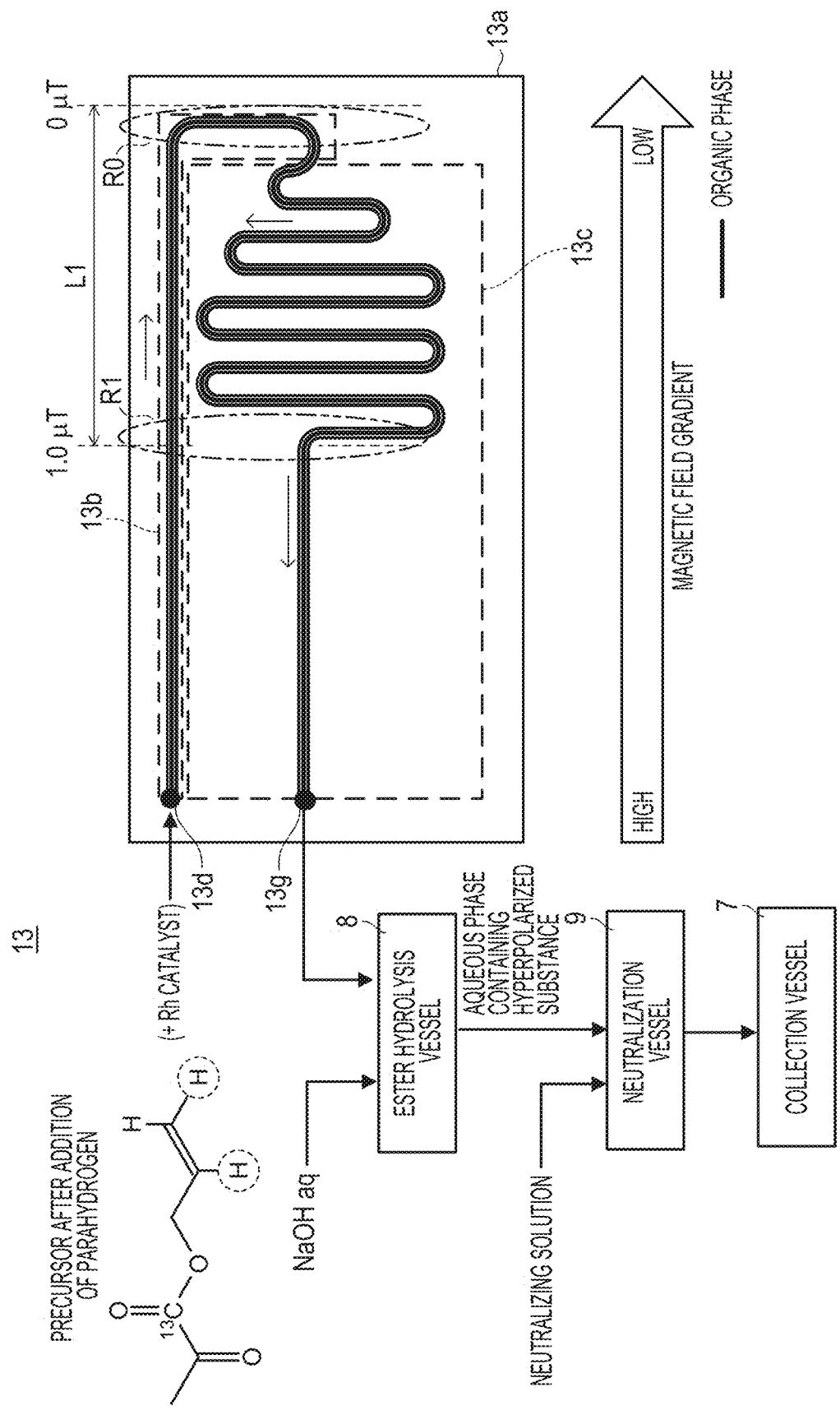
FIG. 14 is a view of a structure of a microfluidic device according to Modified Example 2.

FIG. 14 illustrates the structure of microfluidic device 13 according to Modified Example 2.

In the present embodiment, microfluidic device 13 can be used only for the process of guiding from parahydrogen mixing apparatus 6 to zero magnetic field region R0 and applying a magnetic field variation to separately perform the polarization transfer process and the chemical process. The chemical process after polarization transfer can also utilize a typical device for flow synthesis.

Microfluidic device 13 according to Modified Example 2 does not have first mixing section 13*ca*, second mixing section 13*cb*, and separation section 13*cc* in outlet section 13*c* and directly discharges a precursor passing through polarization transfer induction region L1 of outlet section 13*c* (a hyperpolarized precursor) from first output port 13*g*. In the present modified example, the hyperpolarized precursor is delivered to ester hydrolysis vessel 8 and then to neutralization vessel 9 located outside microfluidic device 13, is subjected to ester hydrolysis and neutralization reactions in ester hydrolysis vessel 8 and neutralization vessel 9, and is collected in collection vessel 7.

Microfluidic device 13 may also be formed by placing a resin or metal tube with an inner diameter of 500 µm or less, preferably 200 µm or less, in magnetic shield 11, instead of forming a groove in the substrate.

Modified Example 3

A hyperpolarized substance produced in polarization transfer apparatus 1 may be directly discharged to an injector, instead of collection vessel 7, after contaminants are removed with an in-line filter. A hyperpolarized substance discharged from the injector may be administered directly to a patient. Thus, a hyperpolarized substance can be administered to a patient without being exposed to the outside air, which is also preferable in terms of hygiene.

Modified Example 4

Polarization transfer apparatus 1 may generate a magnetic field gradient including zero magnetic field region R0 using magnetic field adjustment coil 12 alone and without using magnetic shield 11.

With magnetic shield 11, when magnetic field adjustment coil 12 is used to make the magnetic field strength of the central region in magnetic shield 11 zero, a magnetic field gradient can be naturally generated from the central region of magnetic shield 11 to an end portion. However, magnetic shield 11 disadvantageously increases the size of polarization transfer apparatus 1.

In this regard, for example, magnetic field adjustment coil 12 can be composed of a set of a demagnetization coil and an anti-Helmholtz coil to generate a magnetic field gradient including zero magnetic field region R0 in a space surrounded by magnetic field adjustment coil 12 without using magnetic shield 11. In such an embodiment, for example, the demagnetization coil eliminates the geomagnetism and generates a zero magnetic field region in the space, and the anti-Helmholtz coil generates a magnetic field gradient in the space Other Embodiments The present invention is not limited to these embodiments and may include various modified embodiments.

In the above embodiments, in an example of microfluidic device 13, a precursor flows at an almost constant flow rate. However, microfluidic device 13 according to the present invention is not limited to such an embodiment, and the flow rate of a precursor may be changed in the middle of the flow by making the groove diameter of inlet section 13*b* different from the groove diameter of outlet section 13*c*. Also in outlet section 13*c*, the groove diameter of polarization transfer induction region L1 may be different from the groove diameter of a region downstream of polarization transfer induction region L1 (that is, a region in which the strength of the magnetic field acting on the precursor is approximately 1 µT or more).

In the above embodiments, in an example of microfluidic device 13, a region for inducing polarization transfer of a precursor and a region for performing a chemical process of a hyperpolarized precursor are formed on the same substrate. However, microfluidic device 13 according to the present invention is not limited to such an embodiment, and a region for inducing polarization transfer of a precursor and a region for performing a chemical process of a hyperpolarized precursor may be arranged three dimensionally.

For example, microfluidic device 13 may have a microchannel formed of a PEEK or PTFE tube with an inner diameter of 500 µm or less. When a microchannel is formed of a tube, however, fine channel arrangement is more difficult in this microchannel than in a microchannel formed on a substrate, so that it is difficult to form a channel structure with an optimized strength profile of a magnetic field acting on a precursor or a channel structure in which a polarization transfer process and a chemical process are consistently performed. From this perspective, the microchannel of microfluidic device 13 is preferably formed on substrate 13, as illustrated in FIG. 5.

In the above embodiments, in an example of microfluidic device 13, a precursor is guided between the geomagnetic region and the zero magnetic field region. As described above, however, the induction of hyperpolarization of a precursor depends mainly on a magnetic field variation pattern between approximately 1 µT and the zero magnetic field. Thus, microfluidic device 13 in the present invention may be used only to apply a magnetic field variation pattern between approximately 1 µT and the zero magnetic field to a precursor. In other words, a precursor delivered from parahydrogen mixing apparatus 6 may be guided by a hose from the outside of magnetic shield 11 to position R1 of approximately 1 µT in magnetic shield 11. Furthermore, a precursor guided by microfluidic device 13 from the zero magnetic field to position R1 of approximately 1 µT in magnetic shield 11 may be guided by a hose from position R1 of approximately 1 µT in magnetic shield 11 to the outside of magnetic shield 11.

Although specific examples of the present invention have been described in detail, they are only illustrative and do not limit the claims. The techniques described in the claims include various modifications and changes of these specific examples.

The disclosure in the description, drawings, and abstract of Japanese Patent Application No. 2019-144537 filed on Aug. 6, 2019 are all incorporated herein by reference.

INDUSTRIAL APPLICABILITY

A polarization transfer apparatus according to the present disclosure can stably produce a hyperpolarized substance with a high nuclear spin polarization ratio.

REFERENCE SIGNS LIST

U Hyperpolarized substance production system
1 Polarization transfer apparatus
11 Magnetic shield
12 Magnetic field adjustment coil
13 Microfluidic device
13a Substrate
13b Inlet section (microchannel)
13c Outlet section (microchannel)
13ca First mixing section
13cb Second mixing section
13cc Separation section
13d First input port
13e Second input port
13f Third input port
13g First output port
13h Second output port
13i Magnetic film
2 Precursor supply source
3 Basic solution supply source
4 Neutralizing solution supply source
5 Pump
6 Parahydrogen mixing apparatus
7 Collection vessel
8 Ester hydrolysis vessel
9 Neutralization vessel
R0 Zero magnetic field region
R1 Position of approximately 1 µT
L1 Polarization transfer induction region

The invention claimed is:

1. A polarization transfer apparatus for inducing hyperpolarization of a precursor containing a $^{13}C$ or $^{15}N$ nucleus, comprising:
  a magnetic field adjustment coil for generating a magnetic field gradient including a zero magnetic field region in a space surrounded by the magnetic field adjustment coil; and
  a microfluidic device coupled to a parahydrogen mixing apparatus and located in the space, the microfluidic device in the space guiding the precursor to which parahydrogen is added or the precursor mixed with the parahydrogen in the parahydrogen mixing apparatus,
  wherein the microfluidic device includes a microchannel for guiding the precursor along the magnetic field gradient such that strength of a magnetic field acting on the precursor decreases monotonically from approximately 1 µT to a zero magnetic field at a first change rate, and then guiding the precursor along the magnetic field gradient such that the strength of the magnetic field acting on the precursor increases monotonically from the zero magnetic field to approximately 1 µT at a second change rate, and
  the first change rate is higher than the second change rate.

2. The polarization transfer apparatus according to claim 1, wherein the microchannel includes a first mixing section for mixing a solution containing the precursor with a basic solution for hydrolyzing the precursor after guiding the precursor along the magnetic field gradient such that the strength of the magnetic field acting on the precursor increases monotonically from the zero magnetic field to approximately 1 µT.

3. The polarization transfer apparatus according to claim 2, wherein the microchannel includes a second mixing section for mixing the solution containing the precursor with a neutralizing solution for neutralizing the solution containing the precursor after guiding the precursor along the magnetic field gradient such that the strength of the magnetic field acting on the precursor increases monotonically from the zero magnetic field to approximately 1 µT.

4. The polarization transfer apparatus according to claim 2, wherein the microchannel has a separation section for separating an organic solvent from the solution containing the precursor in a region downstream of the first mixing section.

5. The polarization transfer apparatus according to claim 1, wherein the microfluidic device has a magnetic film for adjusting the magnetic field gradient in a flow direction of the precursor.

6. The polarization transfer apparatus according to claim 1, wherein the microchannel has a groove diameter of 500 µm or less.

7. The polarization transfer apparatus according to claim 1, wherein the microchannel linearly guides the precursor from a position of approximately 1 µT to a position of the zero magnetic field in the space such that the strength of the magnetic field acting on the precursor decreases monotonically from approximately 1 µT to the zero magnetic field at the first change rate.

8. The polarization transfer apparatus according to claim 1, wherein the microchannel meanderingly guides the precursor from a position of the zero magnetic field to a position of approximately 1 µT in the space such that the strength of the magnetic field acting on the precursor increases monotonically from the zero magnetic field to approximately 1 µT at the second change rate.

9. The polarization transfer apparatus according to claim 1, wherein a pattern of a magnetic field variation applied to the precursor in the microchannel is determined based on a substance of the precursor and a position in the precursor at which parahydrogen is added.

10. The polarization transfer apparatus according to claim 9, wherein the pattern of the magnetic field variation applied to the precursor in the microchannel is determined using quantum statistical mechanical simulation based on the substance of the precursor and the position in the precursor at which parahydrogen is added.

11. The polarization transfer apparatus according to claim 1, wherein the first change rate is a rate at which a time to reduce the strength of the magnetic field applied to the precursor from approximately 1 µT to the zero magnetic field is less than 200 milliseconds.

12. The polarization transfer apparatus according to claim 1, wherein the second change rate is a rate at which a time to increase the magnetic field strength applied to the precursor from the zero magnetic field to approximately 1 µT ranges from 0.5 to 20 seconds.

13. The polarization transfer apparatus according to claim 1, wherein the precursor is an unsaturated organic compound.

14. The polarization transfer apparatus according to claim 1, wherein the microfluidic device is coupled to an injector for delivering the precursor with a hyperpolarized $^{13}$C or $^{15}$N nucleus to outside.

15. The polarization transfer apparatus according to claim 1, wherein the microchannel guides the precursor along the magnetic field gradient such that the strength of the magnetic field acting on the precursor decreases monotonically from geomagnetism to the zero magnetic field, and then guides the precursor along the magnetic field gradient such that the strength of the magnetic field acting on the precursor increases monotonically from the zero magnetic field to the geomagnetism.

16. The polarization transfer apparatus according to claim 1, wherein the microchannel is formed of a groove arranged in a plane of a substrate constituting the microfluidic device.

17. The polarization transfer apparatus according to claim 1, comprising a plurality of the microfluidic devices.

18. The polarization transfer apparatus according to claim 1, further comprising a magnetic shield for magnetically shielding the space from outside.

19. A microfluidic device to be applied to the polarization transfer apparatus according to claim 1.

* * * * *